United States Patent
Imaeda et al.

(10) Patent No.: US 7,833,346 B2
(45) Date of Patent: Nov. 16, 2010

(54) METHOD AND APPARATUS FOR MANUFACTURING GROUP III NITRIDE CRYSTALS

(75) Inventors: Minoru Imaeda, Nagoya (JP); Yoshimasa Kondo, Nagoya (JP); Ichiro Okazaki, Kariya (JP)

(73) Assignee: NGK Insulators, Ltd., Nagoya (JP)

( * ) Notice: Subject to any disclaimer, the term of this patent is extended or adjusted under 35 U.S.C. 154(b) by 588 days.

(21) Appl. No.: 11/685,933

(22) Filed: Mar. 14, 2007

(65) Prior Publication Data
US 2007/0215033 A1 Sep. 20, 2007

(30) Foreign Application Priority Data
Mar. 20, 2006 (JP) ............................. 2006-076584

(51) Int. Cl.
C30B 19/00 (2006.01)
C30B 7/00 (2006.01)
C30B 28/06 (2006.01)

(52) U.S. Cl. ...................... 117/64; 72/81; 72/82; 72/83; 72/84; 72/85; 117/87; 117/88; 117/86

(58) Field of Classification Search .................... 117/64, 117/72, 81–88
See application file for complete search history.

(56) References Cited

U.S. PATENT DOCUMENTS

| | | | | |
|---|---|---|---|---|
| 5,868,837 A * | 2/1999 | DiSalvo et al. | ................. | 117/2 |
| 6,350,666 B2 * | 2/2002 | Kryliouk | ..................... | 438/604 |
| 6,413,627 B1 * | 7/2002 | Motoki et al. | ............... | 428/332 |
| 6,468,347 B1 | 10/2002 | Motoki et al. | | |
| 6,924,159 B2 | 8/2005 | Usui et al. | | |
| 7,097,707 B2 * | 8/2006 | Xu | ............................... | 117/13 |
| 7,176,115 B2 * | 2/2007 | Kitaoka et al. | .............. | 438/557 |
| 7,211,839 B2 * | 5/2007 | Kachi et al. | ................. | 257/194 |
| 7,250,640 B2 * | 7/2007 | Sarayama et al. | ........... | 257/189 |
| 7,265,029 B2 * | 9/2007 | Letertre et al. | .............. | 438/458 |
| 7,332,031 B2 * | 2/2008 | Tischler et al. | ................ | 117/97 |
| 7,435,295 B2 * | 10/2008 | Kitaoka et al. | ................ | 117/64 |
| 7,553,368 B2 * | 6/2009 | Butcher et al. | ................ | 117/86 |
| 2001/0006845 A1 * | 7/2001 | Kryliouk | ..................... | 438/607 |

(Continued)

FOREIGN PATENT DOCUMENTS

JP 2000-012900 1/2000

(Continued)

*Primary Examiner*—Robert M Kunemund
*Assistant Examiner*—G. Nagesh Rao
(74) *Attorney, Agent, or Firm*—Burr & Brown

(57) ABSTRACT

There is provided a group III nitride crystal growth method capable of obtaining a material which is a GaN substrate of low defect density capable of being used as a power semiconductor substrate and in which characteristics of n-type and p-type requested for formation of transistor or the like. A growth method of group III nitride crystals includes: forming a mixed melt containing at least group III element and a flux formed of at least one selected from the group consisting of-alkaline metal and alkaline earth metal, in a reaction vessel; and growing group III nitride crystals from the mixed melt and a substance containing at least nitrogen, wherein after immersing a plurality of seed crystal substrates placed in an upper part of the reaction vessel in which the mixed melt is formed, into the mixed melt to cause crystal growth, the plurality of seed crystal substrates are pulled up above the mixed melt.

24 Claims, 6 Drawing Sheets

U.S. PATENT DOCUMENTS

| | | | |
|---|---|---|---|
| 2002/0028564 A1* | 3/2002 | Motoki et al. | 438/460 |
| 2002/0086534 A1* | 7/2002 | Cuomo et al. | 438/689 |
| 2003/0024475 A1* | 2/2003 | Anderson | 118/715 |
| 2004/0003495 A1* | 1/2004 | Xu | 29/832 |
| 2004/0031437 A1* | 2/2004 | Sarayama et al. | 117/36 |
| 2004/0183090 A1* | 9/2004 | Kitaoka et al. | 257/103 |
| 2004/0245535 A1* | 12/2004 | D'Evelyn et al. | 257/94 |
| 2004/0262630 A1* | 12/2004 | Kitaoka et al. | 257/189 |
| 2007/0215033 A1* | 9/2007 | Imaeda et al. | 117/13 |
| 2007/0215035 A1* | 9/2007 | Kitaoka et al. | 117/84 |
| 2009/0173274 A1* | 7/2009 | Sarayama et al. | 117/68 |

FOREIGN PATENT DOCUMENTS

| | | |
|---|---|---|
| JP | 2000-327495 | 11/2000 |
| JP | 2001-102307 | 4/2001 |
| JP | 2003-300799 | 10/2003 |
| JP | 2004-103093 | 4/2004 |
| JP | 2004-260140 | 9/2004 |
| JP | 2004-292286 | 10/2004 |
| JP | 3631724 | 12/2004 |
| JP | 2005-012171 | 1/2005 |
| JP | 2005-187317 | 7/2005 |
| JP | 2005-225681 A | 8/2005 |
| JP | 2005-263622 A | 9/2005 |

* cited by examiner

METHOD AND APPARATUS FOR MANUFACTURING GROUP III NITRIDE CRYSTALS

BACKGROUND OF THE INVENTION

The present invention relates to a method and apparatus for manufacturing a group III nitride substrate.

Group III nitride semiconductors such as gallium nitride (GaN) are expected for application to a power semiconductor, namely a semiconductor device controlling large electric current, and is requested to have high forward blocking voltage, high current multiplication rate and stable or positive thermal coefficient over existent silicon-based semiconductors.

It is known that a power controlling device such as inverter having higher efficiency and smaller size than a silicon-based semiconductor can be realized when such a semiconductor device as described above is realized and used in a hybrid automobile or power supply/distribution facility. In particular, a great merit is provided that a cooling-related mechanism of a power semiconductor can be dispensed with. Development using SiC-based material as a substrate has been already made actively, and semiconductors such as GaN and SiC generally called "wide band gap semiconductor" attract the attention.

For example, as a semiconductor device having group III nitride semiconductor, a variety of transistor structures have been considered in which on a bulk GaN substrate of several hundreds micrometers thick, an epitaxial GaN layer or an AlGaN layer of about several micrometers is formed, and then a metal thin film gate electrode of about several hundreds nanometers, a source electrode and a drain electrode are formed (see JP-A 2004-260140).

Although various growth methods of semiconductor laser substrate have been conventionally studied as for the GaN substrate which forms a base, those having such low defect density that allows use as a power semiconductor substrate have not been obtained. As a power semiconductor substrate, a material in which characteristics of n-type and p-type are controlled is required, and at this time, the silicon, magnesium or the like dopant should be uniformly added to the substrate. Further, in a power semiconductor, it is often the case that each chip is several millimeters square or larger in size for switching of large electric current, and a bulk-like substrate of at least 3 inches, preferably 5 inches in diameter is demanded.

As a technique that brings a bulk GaN substrate into practical use, growth based on HVPE (Hydride Vapor Phase Epitaxy) method is currently known. This technique enables film formation at such high speed as 1 mm/hour at maximum, and for example, JP-A 2000-12900 proposes a method for obtaining a plurality of bulk-like GaN substrates by slicing process or polishing process after growing single-crystal GaN ingot using GaAs as a substrate (see JP-A 2000-12900).

JP-A 2001-102307 proposes to grow single crystal GaN wafer by facet growth using GaAs as a substrate while a mask shape is devised and growth speed is controlled, and to subject the wafer to etching process or polishing process to give a bulk-like GaN substrate. In this case, such an excellent characteristic as the etch pit density of not more than $10^6$ per square centimeter is realized (see JP-A 2001-102307).

In Japanese Patent No. 3631724, after heat treatment of a sapphire substrate on which nitride and a metal thin film are formed, a single-crystal GaN wafer is grown by the HVPE method and etching or polishing is effected, to give a bulk-like GaN substrate. Also in this case, such an excellent characteristic as the etch pit density of not more than $10^6$ per square centimeter is realized (see Japanese Patent No. 3631724).

Since these bulk GaN substrates partly include low defect density regions of not more than $10^4$ per square centimeter, various approaches for controlling growth, for example, by mask pattern at the time of growth and crystal growing condition, have been considered. As a result, the technique has reached to sufficient level for practice of a substrate for semiconductor laser for applying voltage on a light waveguide which is several hundreds micrometers long and several micrometers width, and contributes mass production of GaN-based ultraviolet and blue laser.

However, the above substrate is not satisfactory as a bulk GaN substrate for power semiconductor for which low defect density of not more than $10^4$ per square centimeter is required over the entire area of several millimeters square, and thus leads the problem of deterioration in high pressure resistance characteristic due to such defect.

As another technique that is essentially likely to produce a substrate of low defect density, developing a GaN substrate growing technique from liquid phase is actively attempted in recent years. U.S. Pat. No. 5,868,837 discloses bulk GaN crystal growing technique by liquid phase method using metal sodium as a flux (hereinafter, referred to as sodium flux method). This method makes GaN crystals precipitate by causing Na and Ga metal charged in a crucible to react with nitrogen under high pressure, e.g., under several MPa at 600 to 900° C. Although growth speed is as low as several tens micrometers/hour, low defect density of not more than $10^3$ per square centimeter is obtained over the entire material (see U.S. Pat. No. 5,868,837).

As a growth method of bulk GaN ingot using this method, for example, JP-A 2003-300799 is known. This document discloses a technique in which when bulk GaN crystals are grown from seed single-crystals using sodium as a flux, the flux interface is controlled by evaporating Na from above with respect to the seed crystals. Further, JP-A 2004-292286 discloses as a growth method of bulk GaN ingot, a method of pulling up or pulling down from the seed crystals at interface (see JP-A 2003-300799 and JP-A 2004-292286).

However, assuming growth speed of 20 μm/hour, time as long as about 100 days is required for obtained an ingot of 50 mm long. During this time, a mechanism for evaporating and solidifying Na or additionally charging Ga or additive elements for growing ingot from uniform flux composition is required, and the seed crystal position should be precisely controlled by scanning the growth condition, which complicate the apparatus.

On the other hand, JP-A 2000-327495 discloses means for growing bulk-like GaN by heating nitrogen material and gallium material after deposition of a nitride thin film on a substrate of sapphire or the like. In this document, sodium azide (NaN3) is used as a nitrogen material, and heat decomposition of the same provides pressurized condition in which sodium is flux, and growing condition similar to that in U.S. Pat. No. 5,868,837 is realized (see JP-A 2000-327495).

This method is characterized in that a nitride thin film is formed on a substrate of sapphire or the like by vapor phase growth, for example, laser ablation or CVD method. This method has great potential as a growth method of a large bulk GaN substrate since sapphire from which a large substrate can be obtained is used as a base substrate.

Further, JP-A 2005-12171 discloses that after growing a first group III nitride semiconductor layer on a substrate of sapphire or the like, thereby forming a patterned mask film, a second group III nitride crystals are grown from the semiconductor layer exposing from the mask film as seed crystals (see JP-A 2005-12171).

Inventors of the present application disclosed a technique of obtaining a plurality of 600 μm thick bulk GaN substrates in about two days by using as an epitaxial substrate according to the sodium flux method, a $ScAlMgO_4$ substrate having completely the same lattice constant. We also disclosed that not more than $10^4$ per square centimeter of defect density is obtained in a size of about 10 mm by controlling growth starting point of crystal (see JP-A 2005-187317).

Further, we disclosed that by high pressure method using a hot isotropic pressing equipment, a bulk GaN substrate of about 5 mm can be grown on an AlN thin film on a sapphire substrate in 100 hours (see JP-A 2004-103093).

SUMMARY OF THE INVENTION

It is an object of the present invention to provide a method capable of producing a material which is a bulk GaN substrate of low defect density capable of being used as a power semiconductor substrate and in which characteristics of n-type and p-type requested for formation of transistor or the like are controlled, and to provide an apparatus using the method. Also, it is an object of the present invention to provide a method enabling mass production of bulk GaN substrates having diameter required for a power semiconductor substrate of 3 inches or more, preferably 5 inches or more, and to provide an apparatus using the method.

Specifically, according to the present invention, the following methods and apparatuses using the methods are provided.

First, according to the present invention, there is provided a growth method of group III nitride crystals comprising: forming a mixed melt containing at least group III element, a flux formed of at least one selected from the group consisting of alkaline metal and alkaline earth metal, in a reaction vessel; and growing group III nitride crystals from the mixed melt and a substance containing at least nitrogen, wherein after immersing a plurality of seed crystal substrates placed in an upper part of the reaction vessel in which the mixed melt is formed, into the mixed melt to cause crystal growth, the plurality of seed crystal substrates are pulling up above the mixed melt.

As the group III element, Ga (gallium), Al (aluminum), In (indium) or the like is used. As the flux, Na (sodium) which is alkaline metal is mainly used, and alkaline metals such as Li (lithium), K (potassium), Rb (rubidium) and Cs (cesium) and alkaline earth metals such as Ca (calcium), Sr (strontium) and Ba (barium) may be added.

Here, in the group III nitride crystal growing method according to the present invention, volume of the part where the seed crystal substrates are placed is not more than 70% of volume of melt. Preferably, it is not more than 40%.

Volume and ratio of the part where the seed crystals are provided are calculated in the manner as described below.

Now, considering the case where a crucible of metal tantalum having inner diameter of 150 mm is used as a reaction vessel, and the interior of the crucible is charged with about 2000 grams of metal Na and about 2000 grams of metal Ga and several grams of metal Si. Specific gravities of GaN crystal, melted sodium and melted gallium are known to be about 6.2, about 1, and about 6, respectively.

For example, fifty seed crystal substrates of 100 mm in diameter and 500 μm in thickness are arranged substantially horizontally at 2-mm interval on a member, and the seed crystal substrates are immersed into a cylindrical reaction vessel of 150 mm in diameter.

At this time, when the melt interface is at about 150 mm from the bottom of the reaction vessel, the volume of the part where seed crystals are provided is 785 cubic centimeters, relative to the volume where melt exists of about 2600 cubic centimeters, and thus the ratio is about 30%.

At this time, the periphery and the center of the crucible may be made to have uniform melt composition by natural convection or by forced convection using stirring. However, in the condition that the ratio exceeds 70%, owing to temperature distribution inside the crucible, difference arises in thickness and silicon addition composition between inside and outside the substrate or between substrates. This makes mass production of semiconductor substrate intended in the present invention difficult.

Here, in the growth method of group III nitride crystal of the present invention, a ratio of group III elements which are to be crystallized as nitride crystals in the dissolved group III elements is not more than 90%.

When crystals are grown to a thickness of about 800 μm in the above growth condition, GaN crystals grown on the total of fifty substrates come to about 2000 grams by 5×5×3.14× 0.08×50×6.2, and consumed amount of Ga metal is about 1650 grams (Ga/GaN=0.833), so the ratio of crystallization is determined as being about 83%.

Crystallization in this interval, the flux composition of Ga/Na changes from about ⅓ molar ratio to about 1/20. Influence of Ga metal composition on crystal quality in the sodium flux method is known to be relatively small, however, it is obvious that the smaller the change of flux composition, the more uniform material may be obtained as a semiconductor substrate of silicon addition composition, and the value of crystallization ratio may be variously selected depending on the intended characteristics of the semiconductor substrate.

Here, in the group III nitride crystal growth method according to the present invention, a member in which a plurality of seed crystal substrates can be arranged at substantially regular interval, and the member is formed of a material that will not elute into the flux melt.

As the member on which the seed crystal substrates are arranged, processed materials of metal such as tantalum, niobium, molybdenum or tungsten, and ceramics such as alumina or yttria are used, and a material which will not elute into the flux melt or a combination of such materials may be used to construct a member.

In the group III nitride crystal growth method of the present invention, crystals are grown while an upper end of the part where the seed crystal substrates are arranged is dipped at 5 mm or more below the melt interface.

In the group III nitride crystal growth method of the present invention, a plate-like member is disposed above the part where the seed crystal substrates are placed, and the member is formed of a component which will not elute into the flux melt.

In this case, nitrogen as a GaN forming element is dissolved into a sodium flux solvent from high-pressure nitrogen gas in the atmosphere and is incorporated by dissolution and precipitation reaction in which it precipitates as GaN crystals on the seed crystal substrates. The dissolution speed increases with growth temperature and nitrogen pressure. In particular, since nitrogen concentration is high at about several millimeters from the melt and gas interface, when there are seed crystals in such part, growth proceeds dominantly in this part, so that a problem arises that crystals do not grow in uniform thickness.

This may be soluble by setting the distance from the melt and gas interface to the seed crystal substrates at least 5 mm or more. Also a plate-like member may be placed above the part where the seed crystal substrates are arranged, and crystallization may be caused to occur on the seed crystal substrates after the nitrogen dissolved at the melt interface is entirely uniformized. In this case, the plate-like member may be disposed to cover the melt and gas interface, and to prevent nitrogen atoms from dissolving in the center of the reaction vessel.

These conditions enabled growth of crystals at substantially uniform speed on the plurality of seed crystal substrates because the nitrogen atoms dissolved in the melt from the high pressure nitrogen gas are uniformly distributed in the melt due to natural convection or forced convection.

Here, in the group III nitride crystal growth method of the present invention, an n-type additive element coexists in the reaction vessel.

Here, in the group III nitride crystal growth method of the present invention, a p-type additive element coexists in the reaction vessel.

In general, a power semiconductor substrate requires a material in which n-type and p-type characteristics are controlled, and in this case, it is requested that a dopant which is silicon or the like for n-type and magnesium or the like for p-type is uniformly added to the substrate. Adding concentration of n type or p type is $10^{16-19}$ atoms/cubic centimeter, which corresponds to 1 to 1000 ppm by composition ratio.

As for such an additive, it may be incorporated into crystals substantially uniformly at the time of crystal growth by coexistence of a required amount of metal silicon or metal magnesium in the melt. Of course, doping amount changes according the Ga/Na composition decreases, however concurrent growth of plural substrates allows production of a material in which n-type and p-type characteristics are controlled with sufficient accuracy as a power semiconductor substrate.

Here, in the group III nitride crystal growth method of the present invention, as the seed crystal substrate, a substrate of sapphire on which group III nitride is grown by vapor phase growth method is used. Further, the vapor phase growth method is HVPE method or MOCVD method.

The seed crystal substrate is preferably based on sapphire single-crystal, and as such, a high quality substance having a diameter of 3 to 5 inches has already been produced at a low price. Various ways of epitaxial growth of group III nitride by vapor growth on the sapphire single-crystal are known, and from the view point of film quality and growth rate, HVPE method or MOCVD method is preferably used.

Further, in the group III nitride crystal growth method according to the present invention, a patterned mask film is formed.

It is generally known that crystal nucleation randomly occur on the seed single crystals in liquid phase growth of semiconductor substrate. It is also known that defects such as dislocation accumulate in the association part of the crystal nuclei. In a power semiconductor, each chip should have several millimeters square in size for switching of large current, and a substrate completely defect free in one chip is required. In the field of semiconductor, by crystal growth method while making a pattern of mask film into correspondence with device size, defects in one chip are completely free. In this case, it is preferred to use a mask pattern having the same size with the device, or a mask pattern based on a size corresponding to a set of plural devices.

Further, in the group III nitride crystal growth method according to the present invention, after forming a patterned mask film, a III nitride is grown again by vapor phase growth. A method of obtaining crystals of lower defect density by repeating vapor growth and mask film formation for several times is known in the name of for example, ELO (Epitaxial Lateral Overgrowth) method, and seed single-crystals on which film is formed in this method are also preferably used.

In the group III nitride crystal growth method according to the present invention, an oxide thin film, nitride thin film, carbide thin film, high-melting point metal thin film, or diamond-like carbon is used as a mask. The mask material is selected from those having low reactivity with flux and easily forming a film of nitride.

In the group III nitride crystal growth method according to the present invention, a III nitride is grown again by vapor phase growth after forming a metal film, nitridized in hydrogen-containing gas atmosphere, and forming pores by heat treatment in hydrogen-containing gas atmosphere.

It is known that when group III nitride crystals are grown by HVPE method after forming a mask by the above method, crystals with low defect density can be obtained, and a self-standing substrate is obtained as the GaN substrate peeled from sapphire by controlling porosity. Here, by growing crystals according to sodium flux method, a self-standing substrate can be similarly obtained.

Further, in the group III nitride crystal growth method according to the present invention, group III nitride is grown on both sides of sapphire.

By growing crystals according to sodium flux method after vapor growth nitride on both sides of sapphire according to various methods as described above, it is possible to prevent bowing from occurring in a cooling step.

Further, in the group III nitride crystal growth method according to the present invention, the part of sapphire is removed to give a self-standing substrate. As a mechanical processing method for removing sapphire, a grinding machine for the case of one side growth, and a wire saw for the case of both side growth are used. Also, a laser peeling method by irradiating laser from the sapphire side is known.

Further, in the group III nitride crystal growth method according to the present invention, the part of sapphire is peeled by thermal expansion difference during a cooling step. Various combinations of condition obtained as a self-standing substrate when cooled in HVPE method are known depending on selection of material and pattern of the mask and control of the porosity. Here, by growing crystals according to sodium flux method, a self-standing substrate can be similarly obtained.

Further, in the group III nitride crystal growth method according to the present invention, as the seed crystal substrate, a bulk GaN substrate is used. Further, crystal growth of the bulk GaN substrate is effected by the HVPE method.

If a bulk GaN substrate is available as a seed single crystal, various conditions are significantly simplified compared to the case where a sapphire substrate is used. At present, as a growth method of bulk GaN substrate realizing excellent mass productivity compared to sodium flux method, HVPE method is known, and this may be utilized as seed single-crystals.

Further, in the group III nitride crystal growth method according to the present invention, on the above substrate, a thick film having a thickness of not less than 10 µm and not more than 200 µm is grown. In a power semiconductor, the part where electric current concentrates at most is the part at the upper several micrometers to several tens micrometers. By making the part with a thick film having low defect density, obtained by crystal growth according to sodium flux method, power semiconductor characteristics which are comparative with those in the case where the entirety includes low defect density are obtained.

In the group III nitride crystal growth method according to the present invention, after taking out grown crystals, the melt after growth is added with a raw material in an amount corresponding to the amount that has crystallized as group III nitride crystals and a raw material substantially corresponding to the flux material that has been reduced by vaporization during growth to form a mixed melt, and then crystal growth is repeated.

The melt in sodium flux method can be continuously used for crystal growth for any number of times as far as accumulation of impurities and the like is within an acceptable range. In this case, it is necessary to additionally charge a raw material in an amount corresponding to the amount crystallized into group III nitride crystals and a raw material substantially corresponding to the flux material that has reduced by vaporization during crystal growth so that generally the same flux composition is achieved in every time. As a result, it is possible to grow bulk GaN substrates several times to several tens of times without replacing the flux material inside the crucible.

Further, in the group III nitride crystal growth method according to the present invention, the above steps are carried out in an inert atmosphere. This is because the system dislikes oxygen and moisture as impurities, and it is necessary to carry out a series of steps including taking-out of grown crystals, charging of additional material, and placement of new seed crystals within a dry box in which oxygen concentration and dew point are controlled to not more than specific values.

Further, in the group III nitride crystal growth method according to the present invention, the above steps are carried out at reaction vessel temperature of not less than 300° C. and not more than 500° C. A pressure container in which a reaction vessel has been placed needs to be brought into an atmospheric pressure in the above steps. At this time, it is preferred to keep the reaction vessel at a certain temperature as far as the vaporization of flux ingredient is small. In the step of cooling the flux to room temperature, a problem arises that a vessel of metal tantalum or the like used as a crucible is deformed by stress due to solidification contraction of the flux. This is advantageous in preventing the life of the crucible from decreasing and thus in shortening the time required for the entire steps.

As an apparatus for carrying out the aforementioned steps, two types of apparatuses based on the use pressure region can be assumed.

First, an apparatus of producing group III nitride crystals according to the present invention has at least a supplier for supplying an interior of a pressure container with nitrogen gas and nitrogen mixed gas at 1 to 20 MPa, a heater for heating the reaction vessel in the pressure container to at least 700° C. or higher and a power unit, and the apparatus further has a dry box part disposed outside the pressure container, and a rising/falling and rotational axes disposed outside the pressure container.

Further, an apparatus of producing group III nitride crystals according to the present invention has at least a supplier for supplying an interior of a pressure container with nitrogen gas and nitrogen mixed gas at 20 to 200 MPa, a heater for heating the reaction vessel in the pressure container to at least 700° C. or higher and a power unit, and the apparatus further has a dry box part disposed outside the pressure container, and a rising/failing and rotational axes disposed inside the pressure container.

The apparatus will be explained in detail in Examples.

According to the present invention, it is possible to obtain a material which is a GaN substrate having such low defect density that can be used as a power semiconductor substrate, and in which n-type and p-type characteristics required for formation of a transistor or the like are controlled. Further, it is possible to massively produce bulk GaN substrates having diameter required for a power semiconductor substrate of 3 inches or more, preferably 5 inches or more.

DETAILED DESCRIPTION OF THE INVENTION

In the following, explanation will be made on best mode for carrying out the present invention, however, it is to be noted that the present invention is not limited to the following embodiments, and the following embodiments to which appropriate change or modification is made according to ordinary knowledge of persons skilled in the art are also embraced in the scope of the present invention without departing from the spirit of the present invention.

Figure 1:
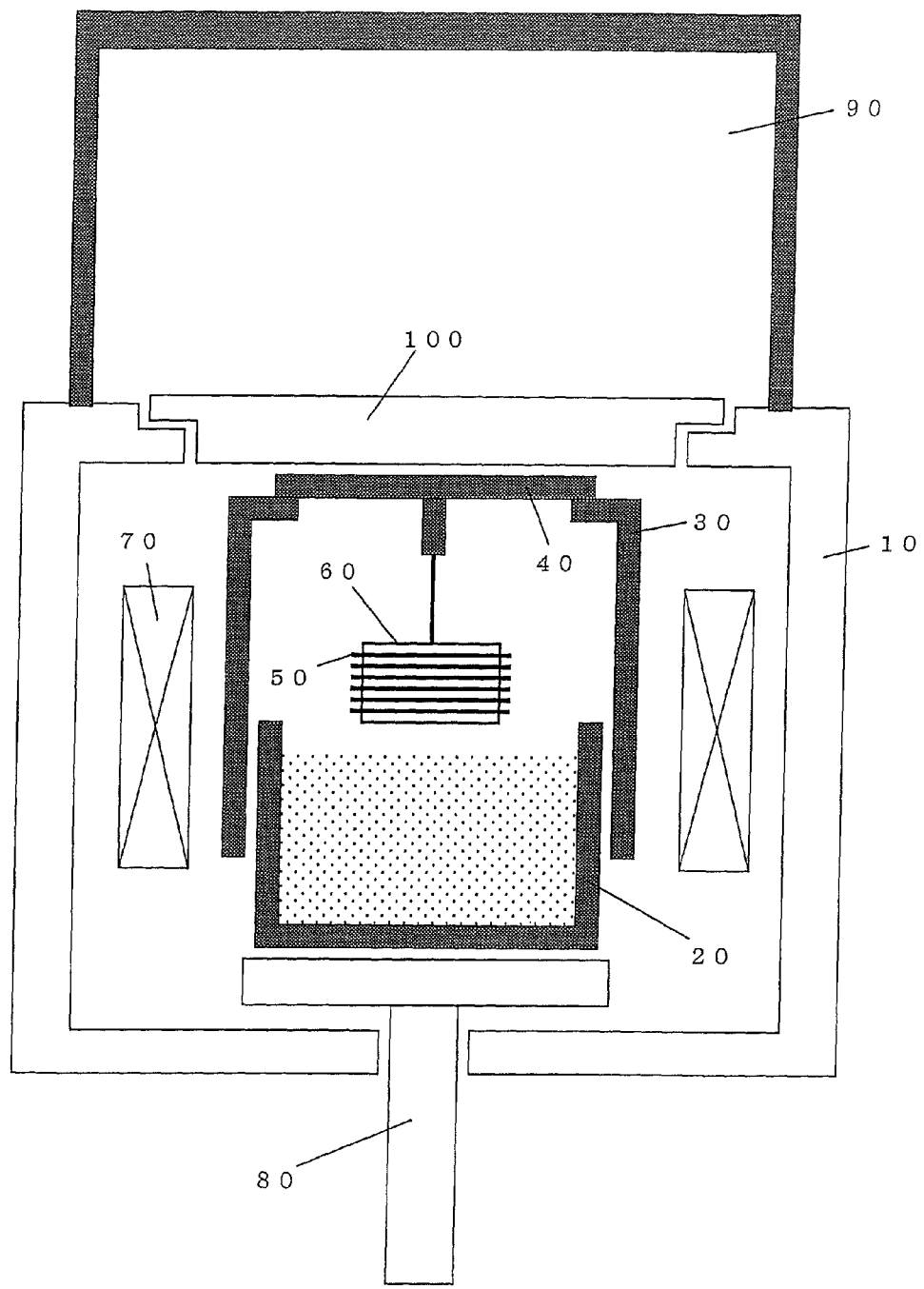
FIG. 1 is a view showing an apparatus according to one embodiment of the present invention.
Figure 2:
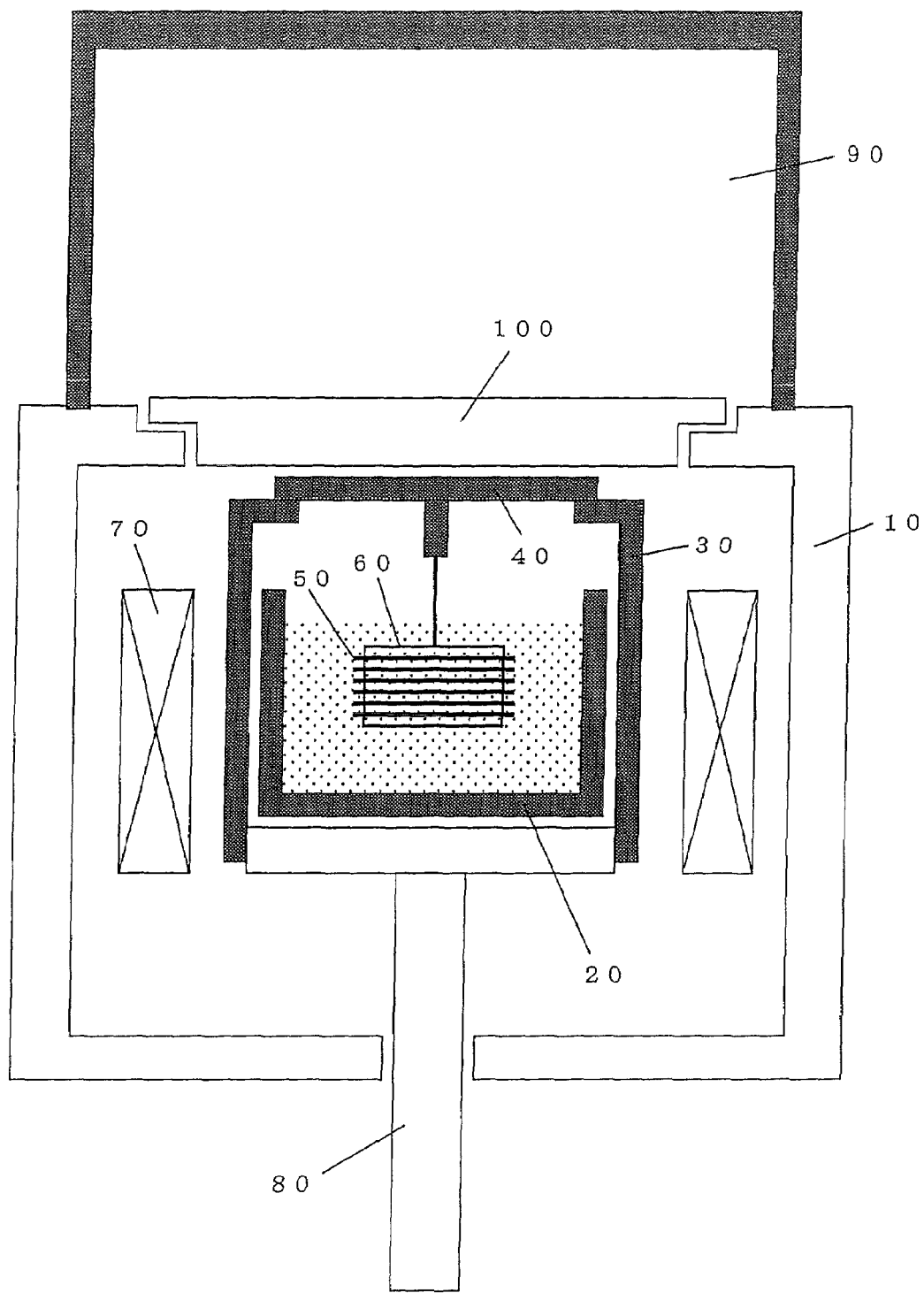
FIG. 2 is a view showing an apparatus according to one embodiment of the present invention.
Figure 3:
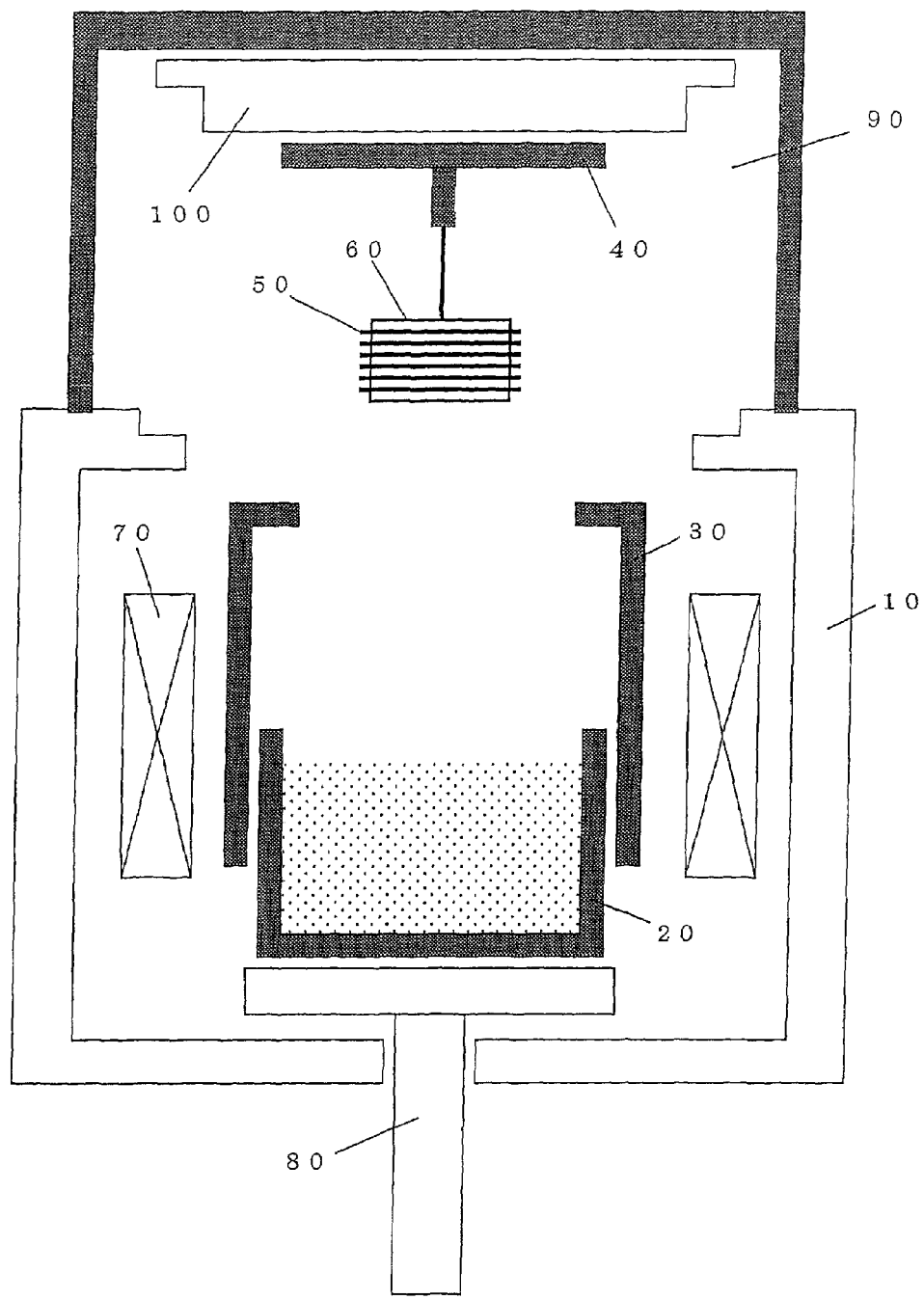
FIG. 3 is a view showing an apparatus according to one embodiment of the present invention.

One exemplary production method of group III nitride crystals according to the present invention will be shown by way of FIG. 1 (before growth), FIG. 2 (during growth) and FIG. 3 (standby state). First, outlines of the apparatus will be explained.

Inside a high-pressure container 10, a reaction vessel 20, an outer vessel 30 covering the reaction vessel 20, and an upper vessel 40 located over the reaction vessel 20 are placed, and as illustrated in the drawing, the upper vessel 40 is provided with an arrangement member 60 in which a plurality of seed crystal substrates 50 are arranged at generally regular intervals. These vessels 10 to 40 and arrangement member 60 are formed from members that show poor reactivity with melt and vapor of flux such as sodium because they come into contact with such melt and vapor.

Outside the reaction vessel 20, a heater 70 for heating is disposed to enable heating of the reaction vessel 20 to between 700° C. and near 1000° C. As a heating system, a resistant heating system, a radio frequency wave system or the like is used.

The reaction vessel 20 is placed on a supporting base 80, and is enabled rising/falling and rotation by an rising/falling mechanism and a rotation mechanism (not shown) provided outside the high-pressure container 10.

The high-pressure container 10 bears 10 MPa at most, and a dry box part 90 is disposed in upper part thereof. By opening/closing the upper pressure container 100, installation of the seed crystal substrate 50 and taking out of grown crystals, charging of additional materials are enabled under inert atmosphere.

Further, nitrogen gas and nitrogen mixed gas supplier (not shown) is connected to the high-pressure container 10, and a power unit for heater is connected to the heater 70 for heating.

EXAMPLES

Example 1

Next, a method of producing a plurality of silicon doped bulk GaN substrates which may be used as n-type semiconductor substrates will be explained.

In the state of FIG. 3, using a metal tantalum crucible having an inner diameter of 150 mm, and a thickness of 2 mm as the reaction vessel 20, about 2000 grams of metal Na, about 2000 grams of metal Ga and a required amount of metal Si were charged.

As the seed crystal substrate 50, fifty substrates were prepared each obtained by causing 400 nm of GaN thin film to grow by MOCVD method on a sapphire C face substrate having a diameter of 100 mm and a thickness of 500 μm, vapor depositing 20 nm of titanium metal thin film, heating for several tens minutes at about 1000° C. with mixed gas of hydrogen and argon, and causing about 2 μm of GaN thin film to grow by MOCVD method.

These fifty seed crystal substrates were arranged substantially horizontally in the arrangement member 60 at 2 mm interval, and placed below the upper vessel 40. This operation is performed in an inert atmosphere through the dry box part 90 disposed above the high-pressure container 10. In setting, the substrates were set so that the GaN thin film face which is to be a growth face was downside.

Next, the upper vessel 40 and the seed crystal substrates 50 disposed in the arrangement member 60 are moved, and further the upper pressure container 100 is moved to make the state of FIG. 1. In this state, nitrogen gas is introduced to adjust the inner pressure of the high-pressure container 10 to about 5 MPa, and at the same time, the reaction vessel 20 was heated to about 800° C. by the heater 70 for heating.

Although uniform composition is achieved by natural convection due to temperature gradient even when the reaction vessel 20 is simply left still, stirring by forced convection generated by rotation of the supporting base 80 can reduce the mixed melt preparing time.

From the state in which mixed melt is prepared in this manner, the plurality of seed crystal substrates 50 disposed in the upper part of the reaction vessel 20 are introduced into the mixed melt to make the state of FIG. 2. In this state, the height of melt from the bottom is about 150 mm, and the height of arrangement member 60 is about 100 mm, and the upper end of the part where the seed crystal substrates 50 are placed is dipped at 30 mm below the melt and gas interface.

Thereafter, crystals were grown in this temperature condition and pressure condition, and after about 48 hours, the grown crystals were pulled up from the mixed melt. The arrangement member 60 was taken outside through the dry box part 90, and the grown single-crystal GaN wafer was taken out as a self-standing substrate peeled from the sapphire which is the seed crystal substrate 50. It was a wafer having mean crystal thickness of 800 μm with standard deviation, namely thickness variation of 30 μm.

At this time, the volume of part where the seed crystal substrates 50 were placed was about 30% of the volume of the melt, and the percentage of crystallized nitride crystals in the dissolved group III element was about 80%.

A step of processing the single-crystal GaN wafer into a bulk GaN substrate for power semiconductor will be briefly explained. First, the face after crystal growth (superficial face) and the face (backside face) which contacts the sapphire substrate are distinguished by marking or the like. Taking the superficial face as a base surface, the backside face was ground to make the thickness about 600 μm, and then mirror finished. Then the superficial face was ground by about 100 μm, and finished by lapping and polishing processes.

Surface characteristics of the obtained bulk GaN substrate were evaluated to reveal that it was a n-type semiconductor having silicon concentration of $5 \times 10^{18}$ per square centimeter and having defect density of not more than $10^3$ per square centimeter, and hence was excellent in quality.

Example 2

Next, a method of producing a plurality of magnesium doped bulk GaN substrates which may be used as a p-type semiconductor substrate will be explained. Structure of the apparatus is as same as that described above.

Using as the reaction vessel 20, a metal tantalum crucible having an inner diameter of 150 mm and a thickness of 2 mm, about 2000 grams of metal Na, about 2000 grams of metal Ga and a required amount of metal Mg were charged.

As the seed crystal substrate 50, fifty substrates were prepared each obtained by causing 400 nm of GaN thin film to grow by MOCVD method on a sapphire C face substrate having a diameter of 100 mm and a thickness of 500 μm, forming a stripe silicon oxide mask pattern thin film of about 10 μm, and causing about 20 μm of GaN thin film to grow by HVPE method.

Growth experiment was conducted in the same condition as in Example 1, and the grown single-crystal GaN wafer was taken out as a self-standing substrate peeled from sapphire which is the seed crystal substrate 50. It was a wafer having mean crystal thickness of 770 μm with standard deviation, namely thickness variation of 25 μm.

At this time, the volume of part where the seed crystal substrates 50 were placed was about 30% of the volume of the melt, and the percentage of crystallized nitride crystals in the dissolved group III element was about 80%.

Processing was conducted in the same condition as in Example 1, surface characteristics of the obtained bulk GaN substrate were evaluated to reveal that the substrate was a p-type semiconductor having magnesium concentration of $3 \times 10^{18}$ per square centimeter and having defect density of not more than $10^3$ per square centimeter, and hence was excellent in quality.

Example 3

Next, a method of making the plurality of GaN substrate surface grown at high speed by HVPE method into a silicon-doped GaN substrates which may be used as an n-type semiconductor will be explained. Structure of the apparatus is similar to the above structure.

Using as the reaction vessel 20, a metal tantalum crucible having an inner diameter of 150 mm and a thickness of 2 mm, about 2300 grams of metal Na, about 500 grams of metal Ga and a required amount of metal Si were charged.

As the seed crystal substrate 50, fifty wafers of 500 μm thick obtained through cutting process and polishing process after growing a C face GaN substrate having a diameter of 100 mm and a thickness of 50 mm by HVPE method were used. In setting, the substrates were set so that the Ga face (+face) which is to be a growth face was downside.

Growth experiment was conducted in the same condition as in Example 1 except that the growth time was 5 hours, and the grown single-crystal GaN wafer was taken out as a substrate in which about 80 μm thick epitaxial growth was made on the HVPE substrate which was the seed crystal substrate 50. It was a wafer having mean crystal thickness of 580 μm with standard deviation, namely thickness variation of 5 μm.

At this time, the volume of part where the seed crystal substrates 50 were placed was about 30% of the volume of the melt, and the percentage of crystallized nitride crystals in the dissolved group III element was about 30%.

Simple lapping process was made on both sides, and surface characteristics of the obtained bulk GaN substrate were evaluated to reveal that the substrate was a n-type semiconductor having silicon concentration of $7\times10^{18}$ per square centimeter and having defect density of not more than $10^3$ per square centimeter, and hence was excellent in quality.

Example 4

Figure 4:
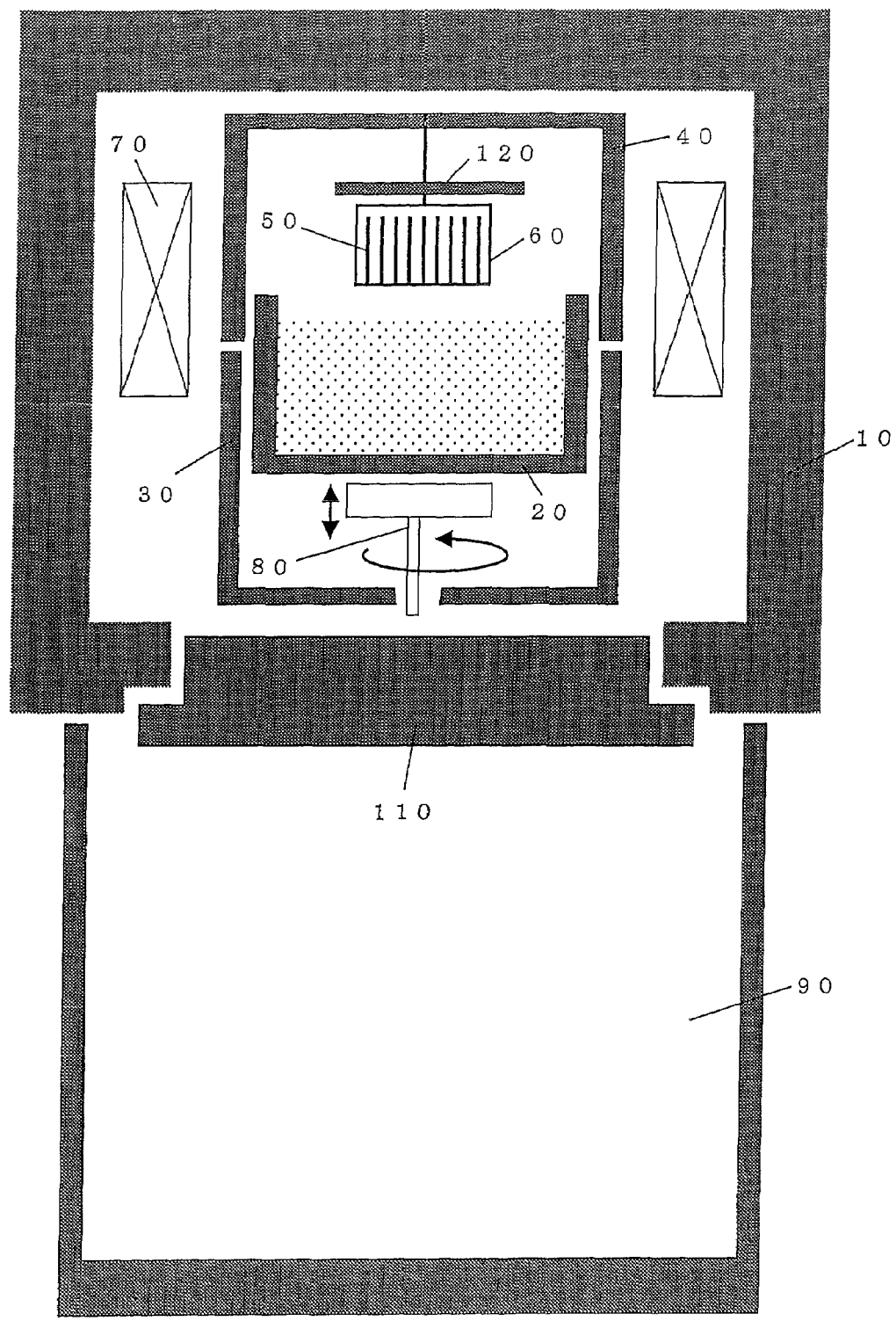
FIG. 4 is a view showing an apparatus according to other embodiment of the present invention.
Figure 5:
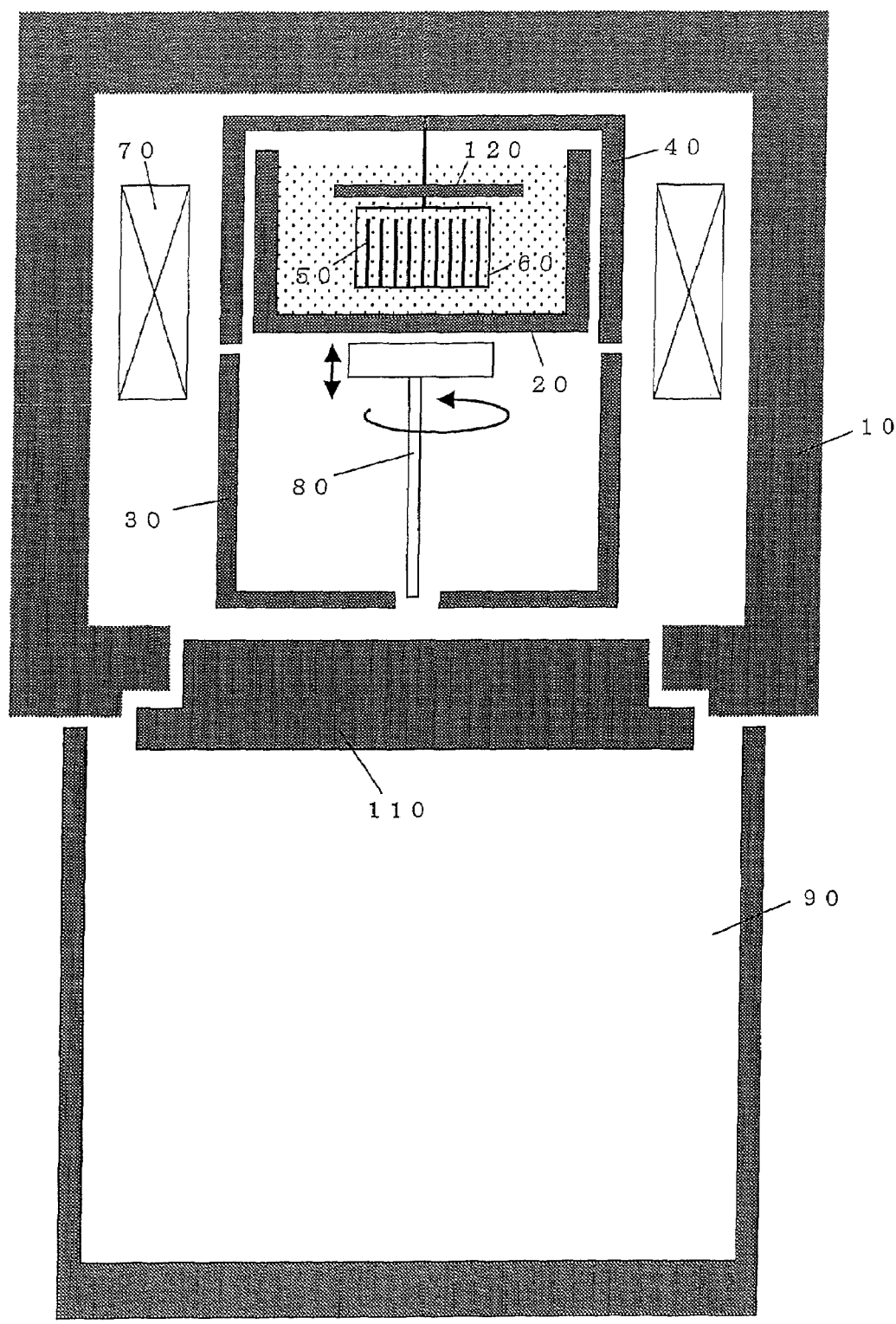
FIG. 5 is a view showing an apparatus according to other embodiment of the present invention.
Figure 6:
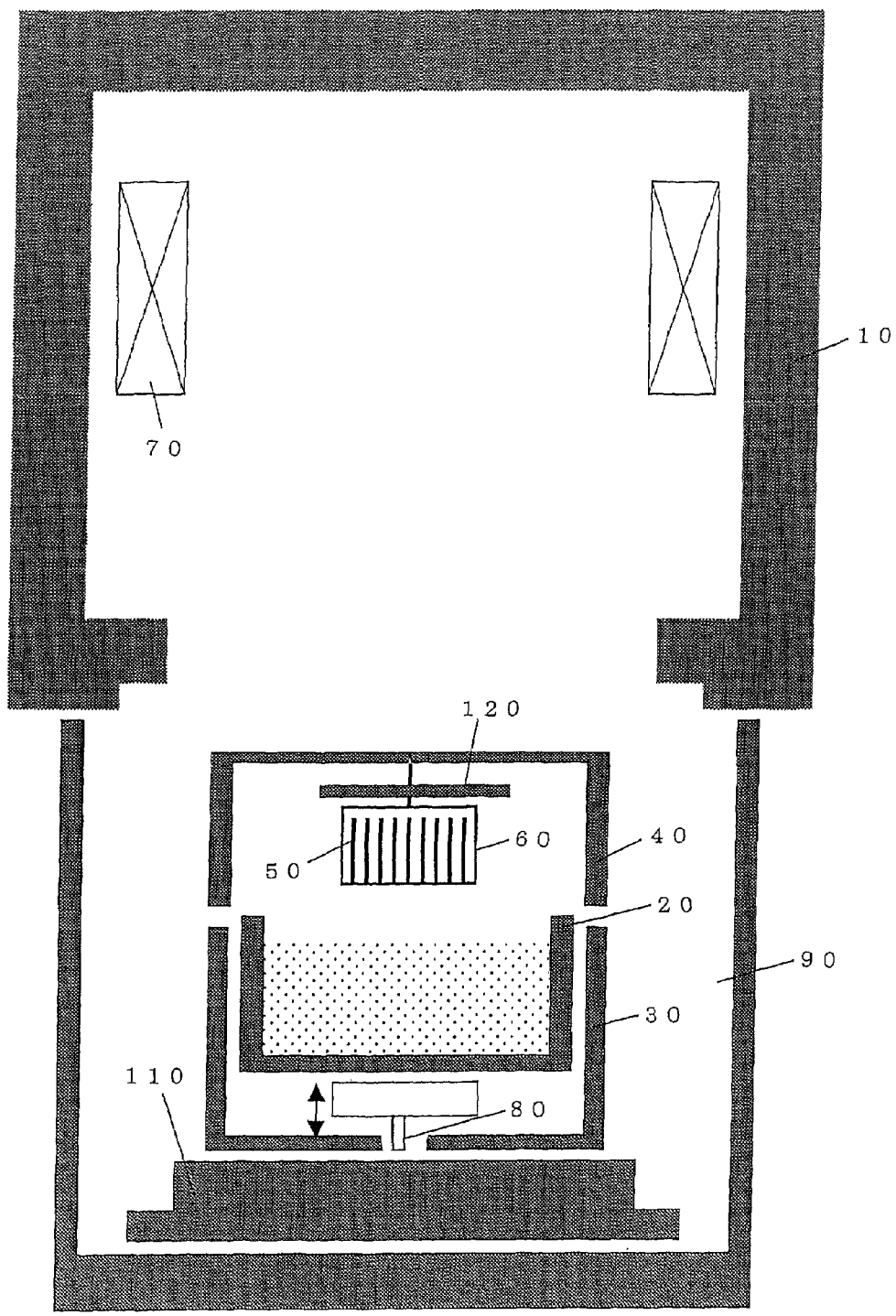
FIG. 6 is a view showing an apparatus according to other embodiment of the present invention.

One exemplary production method of group III nitride crystals according to the present invention will be shown by way of FIG. 4 (before growth), FIG. 5 (during growth) and FIG. 6 (standby state). First, outlines of the apparatus will be explained.

Inside a high-pressure container 10, a reaction vessel 20, an outer vessel 30 covering the reaction vessel 20, and an upper vessel 40 located above the reaction vessel 20 are placed, and as illustrated in the drawing, the upper vessel 40 is provided with an arrangement member 60 in which a plurality of seed crystal substrates 50 are arranged at generally regular intervals. These vessels 10 to 40 and arrangement member 60 are formed from members that show poor reactivity with melt and vapor of flux such as sodium because they come into contact with such melt and vapor.

Outside the reaction vessel 20, a heater 70 for heating is disposed to enable heating of the reaction vessel 20 to 700° C. or higher and up to near 1000° C. As a heating system, a resistant heating system, a radio frequency wave system or the like is used.

The reaction vessel 20 is placed on a supporting base 80, and is enabled rising/falling and rotation by an rising/falling mechanism and a rotation mechanism (not shown) provided inside the high-pressure container 10.

The high-pressure container 10 bears 200 MPa at most, and a dry box part 90 is disposed below thereof. By opening/closing the lower pressure container 110, installation of the seed crystal substrate 50, taking out of grown crystals, and charging of additional materials are enabled under inert atmosphere.

Further, a nitrogen gas and nitrogen mixed gas supplier (not shown) is connected to the high-pressure container 10, and a power unit for heater is connected to the heater 70 for heating.

Next, a method of producing a plurality of silicon doped bulk GaN substrates which may be used as n-type semiconductor substrates will be explained.

In the state of FIG. 6, using a metal tantalum crucible having an inner diameter of 200 mm, and a thickness of 2 mm as the reaction vessel 20, about 3500 grams of metal Na, about 3500 grams of metal Ga and a required amount of metal Si were charged.

As the seed crystal substrate 50, twelve substrates on in which about 20 μm of GaN thin films were grown on both sides of sapphire having a diameter of 100 mm and a thickness of 500 μm by HVPE method were prepared.

These twelve seed crystal substrates 50 were arranged substantially perpendicularly to the arrangement member 60 at 8 mm interval and placed in the upper vessel 40. At this time, two sapphire substrates were placed at interval of about 4 mm in the horizontal direction so that the crystallization speed of the outermost substrate was equal to that of the inner one. Also, a plate-like member 120 having a diameter of 150 mm was disposed above the part where the seed crystal substrates 50 are placed.

This operation is performed in an inert atmosphere through the dry box part 90 disposed below the high-pressure container 10.

Next, the lower pressure container 110 was moved to make the state of FIG. 4. In this state, mixed gas of nitrogen gas and argon (1:1) was introduced to adjust the inner pressure of the high-pressure container 10 to about 50 MPa, while the reaction vessel 20 was heated to about 1000° C. by the heater 70 for heating.

Although uniform composition is achieved by natural convection due to temperature gradient even when the reaction vessel 20 is simply left still, stirring by forced convection generated by rotation of the supporting base 80 can reduce the mixed melt preparing time.

From the state in which mixed melt is prepared in this manner, the plurality of seed crystal substrates 50 disposed in the upper part of the reaction vessel 20 are introduced into the mixed melt to make the state of FIG. 5. In this state, the height of melt from the bottom was about 150 mm, and the height of arrangement member 60 was about 100 mm, and the upper end of the part where the seed crystal substrates 50 are placed was dipped at 30 mm below the melt interface. Further, the plate-like member 120 above the seed crystal substrates 50 was dipped at 10 mm below the melt and gas interface.

Thereafter, crystals were grown in this temperature condition and pressure condition, and after about 20 hours, the grown crystals were pulled up above the mixed melt. The arrangement member 60 was taken outside through the dry box part 90, and the grown single-crystal GaN wafer was taken out as a wafer having crystals grown on both sides of sapphire which is the seed crystal substrate 50. It was a wafer having mean crystal thickness of about 4.5 mm with standard deviation, namely thickness variation of 100 μm.

At this time, the volume of part where the seed crystal substrates 50 are placed was about 20% of the volume of the melt, and the percentage of crystallized nitride crystals in the dissolved group III element was about 55%.

A step of processing the single-crystal GaN wafer into a bulk GaN substrate for power semiconductor will be briefly explained. A wafer after crystal growth is cut by a wire saw so that each two sheets from one side, and a total of four sheets of grown crystals are obtained from two sides. More specifically, crystals are processed into four sheets having a thickness of about 800 μm with a total of three wires consisting of one for sapphire part of each crystal, and each one for middle parts of right and left grown crystals. At this time, the face of growing direction of GaN crystal of each side (superficial face) and the face of sapphire substrate side (backside face) are distinguished by marking or the like. Inner face was ground to make the thickness about 600 μm, and mirror finished. Then the superficial face was ground by about 100 μm, and finished by lapping and polishing processes.

Surface characteristics of the obtained bulk GaN substrate were evaluated to reveal that the substrate was a n-type semiconductor having silicon concentration of 5 to $6\times10^{18}$ per square centimeter and having defect density of not more than $10^3$ per square centimeter, and hence was excellent in quality.

Example 5

Next, a method of producing a plurality of silicon doped GaN substrates which may be used as n-type semiconductor by producing single-crystal GaN ingot using the bulk GaN substrates grown in the present growth method as seed crystals will be explained. Structure of the apparatus is as same as that in Example 4.

Using as the reaction vessel 20, a metal tantalum crucible having an inner diameter of 200 mm and a thickness of 2 mm, about 7000 grams of metal Na, about 7000 grams of metal Ga and a required amount of metal Si were charged.

As the seed crystal substrate 50, four sodium flux method-grown GaN substrates having a diameter of 100 mm and a thickness of 500 μm were prepared, and the substrates were placed substantially horizontally with the Ga face down and arranged at interval of about 40 mm. At the lowermost part, a sapphire substrate was additionally placed. In this state, the height of melt from the bottom was about 300 mm, and the height of arrangement member 60 was about 200 mm, and the upper end of the part where the seed crystal substrates 50 are placed was dipped at 70 mm below the melt interface. Further, the plate-like member 120 above the seed crystal substrates 50 was dipped at 10 mm below the melt interface.

Thereafter, crystal growth was conducted in the same temperature condition and pressure condition as in Example 4, and crystals grown after 10 days were pulled up above the mixed melt. It was an ingot having average value of thickness of the crystals of about 25 mm.

At this time, the volume of part where the seed crystal substrates 50 are placed was about 15% of the volume of the melt, and the percentage of crystallized nitride crystals in the dissolved group III element was about 55%.

A step of processing the single-crystal GaN ingot into a bulk GaN substrate for power semiconductor will be briefly explained. First, the ingot after crystal growth was cut into about twenty-five wafers from the thickness of 25 mm with a wire saw. At this time, the face of GaN ingot growing direction (superficial face) and the face of GaN substrate side (backside face) are distinguished by marking or the like. Backside face was removed by grinding to make the thickness about 600 μm, and mirror finished. Then the superficial face was removed by grinding by about 100 μm, and finished by lapping and polishing processes.

Surface characteristics of the obtained bulk GaN substrate were evaluated to reveal that it was a n-type semiconductor having silicon concentration of 5 to $8\times10^{18}$ per square centimeter and having defect density of not more than $10^3$ per square centimeter, and hence was excellent in quality.

What is claimed is:

1. A method of growing group III nitride crystals comprising:
   forming a mixed melt containing at least group III element and a flux formed of at least one selected from the group consisting of alkaline metal and alkaline earth metal, in a reaction vessel; and
   growing group III nitride crystals from the mixed melt and a substance containing at least nitrogen,
   wherein after introducing a plurality of seed crystal substrates, placed in an upper part of the reaction vessel in which the mixed melt is formed, into the mixed melt to cause crystal growth, the plurality of seed crystal substrates are drawn out above the mixed melt,
   wherein a plate-like member is disposed above the part where the seed crystal substrates are placed, the member is formed of a component which will not elute into the melt, and the member covers the melt/gas interface to prevent nitrogen atoms from dissolving in the center of the reaction vessel.

2. The method of growing group III nitride crystals according to claim 1, wherein volume of the part where the seed crystal substrates are placed is not more than 70% of volume of melt.

3. The method of growing group III nitride crystals according to claim 1, wherein volume of the part where the seed crystal substrates are placed is not more than 40% of volume of melt.

4. The method of growing group III nitride crystals according to claim 1, wherein a ratio of group III elements which are to be crystallized as nitride crystals in the dissolved group III elements is not more than 90%.

5. The method of growing group III nitride crystals according to claim 1, wherein a member in which a plurality of seed crystal substrates can be arranged at substantially constant interval, and the member is formed of a material that will not elute into the melt.

6. The method of growing group III nitride crystals according to claim 1, wherein crystals are grown while an upper end of the part where the seed crystal substrates are arranged is dipped at 5 mm or more below the melt interface.

7. The method of growing group III nitride crystals according to claim 1, wherein said plate-like member is disposed directly above the seed crystal substrates, and the plate-like member comes into contact with the mixed melt.

8. The method of growing group III nitride crystals according to claim 1, wherein an n-type additive element coexists in the reaction vessel.

9. The method of growing group III nitride crystals according to claim 1, wherein a p-type additive element coexists in the reaction vessel.

10. The method of growing group III nitride crystals according to claim 1, wherein as the seed crystal substrate, a substrate of sapphire on which group III nitride is grown by vapor growing method is used.

11. The method of growing group III nitride crystals according to claim 10, wherein the vapor growing method is HVPE method or MOCVD method.

12. The method of growing group III nitride crystals according to claim 10, wherein a patterned mask film is formed.

13. The method of growing group III nitride crystals according to claim 12, after forming a patterned mask film, a second group III nitride is vapor grown.

14. The method of growing group III nitride crystals according to claim 12, wherein an oxide thin film, nitride thin film, carbide thin film, high-melting point metal thin film, or diamond-like carbon is used as a mask.

15. The method of growing group III nitride crystals according to claim 10, wherein a second group III nitride is vapor grown after forming a metal film, nitriding in hydrogen-containing gas atmosphere, and forming a gap by heat treatment in hydrogen-containing gas atmosphere.

16. The method of growing group III nitride crystals according to claim 10, wherein group III nitride is grown on both sides of sapphire.

17. The method of growing group III nitride crystals according to claim 10, wherein the part of sapphire is removed to give a self-standing substrate.

18. The method of growing group III nitride crystals according to claim 10, wherein the part of sapphire is peeled by thermal expansion difference during a cooling step.

19. The method of growing group III nitride crystals according to claim 1, wherein as the seed crystal substrate, a bulk GaN substrate is used.

20. The method of growing group III nitride crystals according to claim 19, wherein crystal growth of the bulk GaN substrate is effected by the HVPE method.

21. The method of growing group III nitride crystals according to claim 19, wherein a thick film having a thickness of not less than 10 μm and not more than 200 μm is grown.

22. The method of growing group III nitride crystals according to claim 1, wherein after taking out grown crystals, the melt after growth is added with a raw material in an amount corresponding to the amount that has crystallized as group III nitride crystals and a raw material substantially corresponding to the flux material that has been reduced by vaporization during growth to form a mixed melt, and then crystal growth is repeated.

23. A method of growing group III nitride crystals, wherein the step described in claim 22 is conducted in an inert atmosphere.

24. The method of growing group III nitride crystals according to claim 22, wherein the step described in claim 22 is conducted at a reaction vessel temperature of not more than 500° C.

* * * * *